United States Patent

[11] 3,593,219

[72] Inventor Hidetoshi Tsuchiya
Suzaka-shi, Japan

[21] Appl. No. 744,927
[22] Filed July 15, 1968
[45] Patented July 13, 1971
[73] Assignee Toko Kabushiki Kaisha
Tokyo-to, Japan
[32] Priority July 24, 1967
[33] Japan
[31] 42/47532

[54] CERAMIC FILTER FOR HIGH FREQUENCIES
8 Claims, 5 Drawing Figs.

[52] U.S. Cl. .......... 333/72, 333/9.5, 333/9.7
[51] Int. Cl. .......... H03h 9/04, H01v 7/00
[50] Field of Search .......... 333/72; 310/8, 8.1, 8.2, 9.5, 9.7, 9.8

[56] References Cited

UNITED STATES PATENTS

| | | | |
|---|---|---|---|
| 2,969,512 | 1/1961 | Jaffe et al. | 333/72 |
| 3,348,078 | 10/1967 | Nagata et al. | 310/9.5 |
| 3,396,327 | 8/1968 | Nakazawa | 333/72 |

*Primary Examiner*—Herman Karl Saalbach
*Assistant Examiner*—Marvin Nussbaum
*Attorneys*—Robert E. Burns and Emmanuel J. Lobato

ABSTRACT: At least two filter elements one having a steeply peaked and narrow-band characteristic and one having a wide-band and gently sloping skirt characteristic are formed and electrically connected on a single piezoelectric ceramic plate to form a ceramic filter for high frequencies of 5 MHz. and higher in which thickness shear vibration is utilized, and which exhibits low spurious response of suitable bandwidth and a steep cutoff characteristic.

CERAMIC FILTER FOR HIGH FREQUENCIES

BACKGROUND OF THE INVENTION

This invention relates generally to the field of band-pass filters and more particularly to a new ceramic filter for high frequencies of 5MHz. and higher in which thickness shear vibration is utilized.

Among ceramic filters known heretofore in which thickness shear vibration is utilized, very few are being used for high frequencies of the order of 5MHz., and there are almost none which are being used for frequencies above 10MHz.

While one reason for this is that a decrease in the thickness of a piezoelectric ceramic plate gives rise to the problem of mechanical strength, the principal reason may be considered to be the difficulty in bandwidth adjustment and in suppressing spurious response.

Attempts have heretofore been made to overcome these difficulties as described hereinafter, but none have been entirely successful as far as I am aware.

SUMMARY OF THE INVENTION

It is an object of the present invention to overcome the above described difficulties. More specifically, an object of the invention is to provide a ceramic filter for high frequencies in which the spurious response is very feeble and has a suitable bandwidth, and which exhibits a steep cutoff characteristic.

According to the present invention, briefly summarized, there is provided a ceramic filter for high frequencies comprising a single piezoelectric ceramic plate and two or more filter elements of mutually different characteristics, that is, a steeply peaked and narrow-band characteristic and a wide-band and gently sloping skirt characteristic, the filter elements being disposed and electrically connected on the ceramic plate.

The nature, principle, details, and utility of the invention will be more clearly apparent from the following detailed description when read in conjunction with the accompanying drawings.

DETAILED DESCRIPTION

Figure 1:
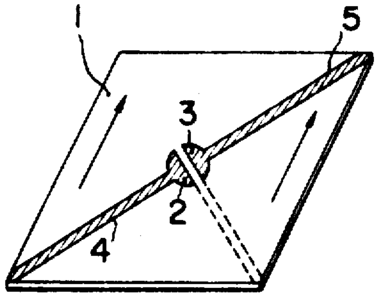
FIG. 1 is a perspective view showing an example of a ceramic band-pass filter for high frequencies of known two-mode type in which thickness shear vibration is utilized.

One example of a ceramic filter devised to overcome the aforedescribed problem, as illustrated in FIG. 1, comprises a rectangular piezoelectric ceramic plate 1, small split electrodes or members 2 and 3, each of semicircular shape, and high frequency lead-in and lead out conductors or members 4 and 5, respectively, formed integrally with the electrodes 2 and 3 by a technique such as silver evaporation deposition or screen printing on a diagonal of the ceramic plate 1. Thus, the electrode 2 and the lead-in member 4 form an input circuit, while the electrode 3 and the lead out member 5 form an output circuit.

In addition, a circular electrode (not shown) of approximately the same size as the entire combination of the semicircular split electrodes 2 and 3 is provided in opposition thereto on the reverse side of the piezoelectric ceramic plate 1. Furthermore a lead wire as indicated by intermittent lines is connected to the opposing electrode and disposed to intersect perpendicularly the above mentioned input and output circuits. In FIG. 1, the arrows indicate the polarization direction of the plate 1.

Figure 3:
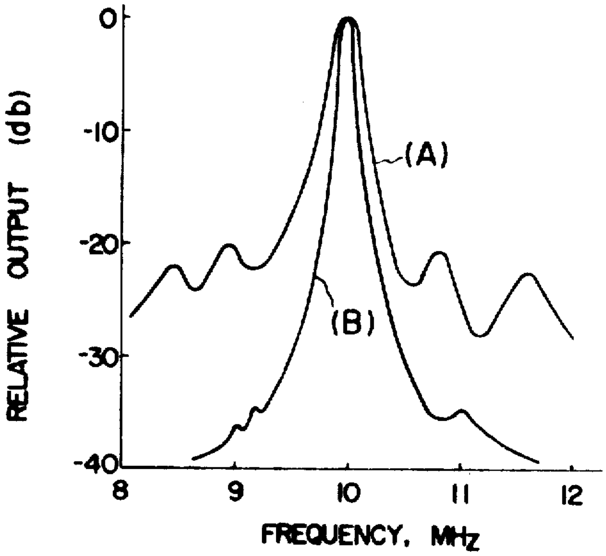
FIG. 3 is a graphical representation showing curves indicating the relationship between output voltage and frequency respectively of the high frequency ceramic filters shown in FIGS. 1 and 2.

However, even in a ceramic filter of this improved type, the suppression of spurious frequency response is not sufficient as indicated by curve (A) in FIG. 3. A further disadvantageous feature is that the cutoff characteristic for a suitably selected band are not completely satisfactory.

The present invention contemplates the elimination of the above described disadvantages accompanying ceramic filters of the type illustrated in FIG. 1 and the provision of a ceramic filter in which spurious response is very feeble and has a suitable bandwidth, and which exhibits a steep cutoff characteristic.

The objects of the invention can be achieved, in general, by providing on a single piezoelectric ceramic plate two or more filters elements of mutually different characteristics, that is, a steep and narrow-band characteristic and a wide-band and gently sloping skirt characteristic and electrically connecting these elements on the ceramic plate.

Figure 2:
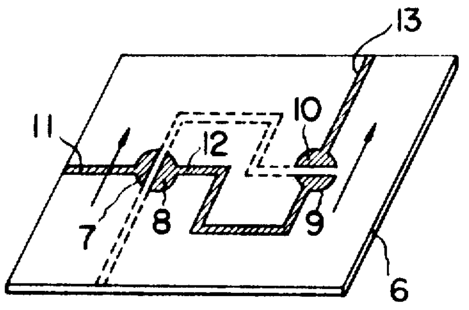
FIG. 2 is a perspective view showing one example of a ceramic filter for high frequencies constituting a preferred embodiment of the invention.

In a preferred embodiment of the invention as illustrated in FIG. 2, two filter elements of such different characteristics are formed on the left and right parts (as viewed in FIG. 2) of a piezoelectric ceramic plate 6 having opposed major surfaces. For example, small semicircular split electrodes or members 7 and 8 having a split direction coincident with or parallel to the polarization direction of the plate is indicated by arrows are provided on the left part of the plate 6, while split electrodes or members 9 and 10 of the same shape having a split direction perpendicular to the polarization direction are provided on the right part of the plate.

The electrodes 7 and 10 are, respectively, connected to a lead-in conductor or member 11 and a lead out conductor or member 13, and the electrodes 8 and 9 are connected through an intermediate conductor or connection lead 12, whereby two filter elements are formed on the left and right sides and interconnected. In other words, the conductors 11, 12, and 13 and the split electrodes 7, 8 and 9, 10 (and the opposing electrodes and conductors on the other major surface which are not shown) comprise conductor means which is twice interrupted, i.e., at the split electrodes. As shown in the drawing, each pair of electrode members 7, 8 and 9, 10 is separated by a space defining the two interruptions and which divides the conductor means into spaced-apart sections. Furthermore, opposing electrodes (not shown) of circular shape and of approximately the same size as the combinations of split electrodes 7, 8 and 9, 10 are disposed in opposition or in superposed relationship thereto on the reverse side of the piezoceramic plate 6. These opposing electrodes are connected by an electrical conductor comprising lead wires which are disposed in directions substantially perpendicular to the lead-in and lead out members 11 and 13 on the front side of the plate 6.

Figure 4:
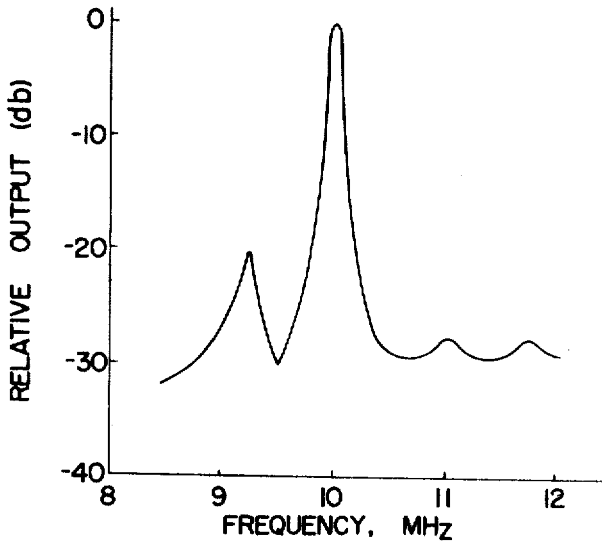
FIGS. 4 and 5 are similar graphical representations showing curves indicating relationships between output voltage and frequency respectively of the three-terminal filters of split electrodes at the left half and right half of the filter illustrated i FIG. 2.

The ceramic filter of the above described organization has operational characteristics as described below with respect to vibration modes as expressed by degrees referred to coordinate axes $x$, $y$, and $z$, where $x$ is in the polarization direction, $y$ is in the direction of thickness of the plate 6, and $z$ lies in the plane of the plate surface and is perpendicular to axis $x$ 1. In the filter element formed in the left part of the plate 6 by the combination of the split electrodes 7 and 8, the principal vibration is of a mode such that the degree of vibration is of $x=1$, $y=1$, and $z=0$ is strongly excited, and vibrations of other modes as, for example, a vibration of $x=1$, $y=1$, $z=1$, are extremely weak. The nature of this vibration is indicated as frequency response by a curve such as that in FIG. 4. Since only the principal vibration is strongly promoted, the skirt characteristic, although being sharp, has the disadvantage of narrow bandwidth.

Figure 5:
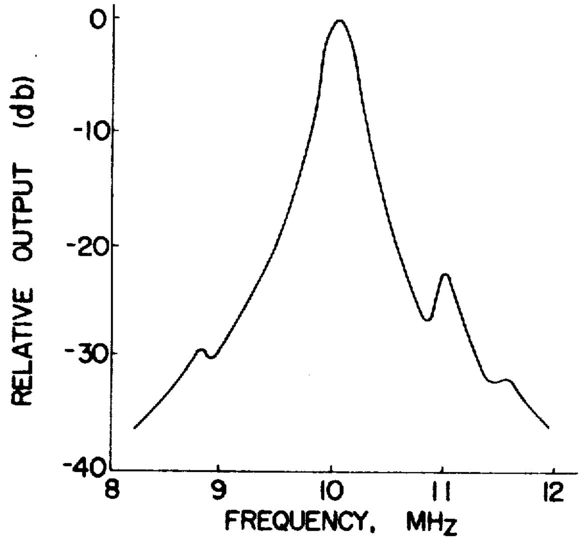

2. In the filter element formed in the right part by the combination of the split electrodes 9 and 10, vibrations of two modes $x=1$, $y=1$, and $z=0$ and $x=2$, $y=1$, and $z=0$ are both very strongly excited because of the mutual relationship between the electrode split direction and the polarization direction. A vibration of a mode $x=1$, $y=1$, and $z=1$ is generated to a slight degree similarly as in the case of the combination of electrodes 7 and 8. The characteristic of this vibration is indicated as frequency response by a curve such as that in FIG. 5.

In this case, since there is a coupling of the vibrations of the two modes $x=1$, $y=1$, and $z=0$ and $x=2$, $y=1$, and $z=0$, a coupled resonance is produced. As a result, the band is substantially wider than that in the case illustrated in FIG. 4, whereby the cutoff characteristic is poor.

However, when two ceramic filter elements as described above are formed on a single polarized, piezoelectric ceramic plate 6 and connected through a connection lead 12, the combined filter between the lead-in member 11 and the lead out member 13 has a suitable band width and, moreover, exhibits a steep cutoff characteristic as indicated by curve (B) in FIG. 3.

Thus, the present invention provides a ceramic filter in which there are connected a plurality of filter elements having response characteristics wherein, although the frequency of the principal vibration is the same, the spurious characteristic differ, and which, as a result, has the desirable feature of a spurious response which is very feeble in relation to the principal response as indicated by curve (B) in FIG. 3.

In one example of actual practice, split electrodes each consisting of semicircular electrodes of 0.7 mm. radius with a 0.2 mm. gap therebetween were provided on a rectangular piezoelectric ceramic plate measuring 5×8 mm. in planar view and having a thickness of 0.12 mm. Lead members were of 0.2 mm. width and approximately 2 mm. length. As a result, a ceramic filter having excellent characteristics at a center frequency of 10 MHz. and a band width of approximately 200 kHz. was obtained.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claims.

I claim:

1. A ceramic three terminal filter for high frequency use comprising: a single piezoelectric ceramic plate and at least two filter elements having mutually different characteristics produced by varying the combined modes of thickness shear vibration, one of said elements having a steeply peaked and narrow-band characteristic and the other having a wide-band and gently sloping skirt characteristic, said filter elements being electrically connected in series and mounted on said piezoelectric ceramic plate.

2. The ceramic three terminal filter as claimed in claim 1; in which the piezoelectric ceramic plate has a polarization direction, and the two filter elements comprise respective split electrodes with split directions respectively perpendicular and parallel to said polarization direction, electrical conductors connecting together said split electrodes in series on one surface of said ceramic plate and terminating in two terminals of said filter, and wherein each said filter element is further provided with another electrode attached onto another surface of said ceramic plate in superposed relationship with respect to each said split electrode, said another electrode of both filter elements being connected in series by a lead conductor and attached onto said another surface, one end of said lead conductor terminating in a third terminal of said filter.

3. A frequency filter comprising: a piezoelectric ceramic plate having a pair of opposed major surfaces and a given polarization direction; a first split electrode on one of said major surfaces comprising two electrode members spaced apart along an axis parallel to said polarization direction; a second split electrode on said one major surface comprising two electrode members spaced apart along an axis perpendicular to said polarization direction; an intermediate conductor electrically interconnecting one member of each said first and second split electrodes; a first conductor electrically connected to the other member of said first split electrode; a second conductor electrically connected to the other member of said second split electrode; and an electrical conductor on the other of said major surfaces including portions superposed in relation to said first and second split electrodes.

4. A frequency filter according to claim 3; wherein said first conductor, second conductor and electrical conductor each extend to an edge portion of said piezoelectric ceramic plate.

5. A frequency filter according to claim 3; wherein each of said members is configured as a semicircle.

6. A three terminal filter device comprising: a piezoelectric plate responsive to electric signal potentials applied thereto to resonate in a thickness shear vibration mode to develop therein a corresponding electric signal, said piezoelectric plate having a pair of opposed major surfaces and a given polarization direction; and conductor means receptive of electric signal potentials during use of the device for applying same to said opposed major surfaces of said piezoelectric plate and receiving therefrom corresponding electric signals developed within said piezoelectric plate and having two interruptions on one of said major surfaces, each said interruptions comprising means defining an elongated space dividing said conductor means into spaced-apart sections, and wherein one of said elongated spaces extends parallel to said polarization direction and the other of said elongated spaces extends perpendicular to said polarization direction.

7. A three terminal filter device according to claim 6; wherein said conductor means includes an electric conductor mounted on the other of said major surfaces positioned in superposed relationship with respect to both said two interrupted portions.

8. A three terminal filter device according to claim 7; wherein said conductor means terminates at three locations on edge portions of said piezoelectric plate.